(12) United States Patent
Okuda et al.

(10) Patent No.: US 6,667,913 B2
(45) Date of Patent: Dec. 23, 2003

(54) SEMICONDUCTOR MEMORY DEVICE

(75) Inventors: Masaki Okuda, Kawasaki (JP); Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/285,425

(22) Filed: Nov. 1, 2002

(65) Prior Publication Data

US 2003/0210577 A1 Nov. 13, 2003

(30) Foreign Application Priority Data

May 9, 2002 (JP) ....................... 2002-134073

(51) Int. Cl.[7] .............................................. G11C 16/04
(52) U.S. Cl. ............. 365/189.07; 365/194; 365/225.07; 365/230.08; 365/233; 327/158; 327/276; 327/278; 327/292
(58) Field of Search ........................... 365/189.07, 233, 365/225.07, 230.08, 194; 327/278, 158, 292, 276

(56) References Cited

U.S. PATENT DOCUMENTS 5,062,081 A * 10/1991 Runaldue ............... 365/230.05
5,691,952 A * 11/1997 Sasaki et al. ........... 365/230.08
6,456,129 B1 * 9/2002 Tsukude ...................... 327/156
2002/0050847 A1 * 5/2002 Tanuguchi et al. ........ 327/278

* cited by examiner

Primary Examiner—Richard Elms
Assistant Examiner—Pho Luu
(74) Attorney, Agent, or Firm—Arent Fox Kintner Plotkin & Kahn, PLLC (57) ABSTRACT

A phase adjustment circuit delays an external clock signal to generate an adjusted clock signal. A phase comparator compares phases of the external clock signal and the adjusted clock signal, and outputs a phase adjustment signal for adjusting a delay time of the phase adjustment circuit. A data output circuit outputs read data to a data terminal in synchronization with the adjusted clock signal. A data input circuit receives write data supplied to the data terminal, in synchronization with the adjusted clock signal. When performing input of the write data and output of the read data successively, switching control between the input operation of the write data and the output operation of the read data only has to be completed within one clock cycle. The clock cycle can thus be reduced to the time required for the switching control. Consequently, maximum frequency of the external clock signal can be increased.

4 Claims, 12 Drawing Sheets

SEMICONDUCTOR MEMORY DEVICE

BACKGROUND OF THE INVENTION

1. Field of the Invention

The present invention relates to a clock synchronous semiconductor memory device, and more particularly, to a semiconductor memory device which implements a DLL (Delay Locked Loop) circuit for synchronizing an internal clock signal used in internal circuitry to an external clock signal.

2. Description of the Related Art

Recently, such semiconductor memory devices as an SDRAM (Synchronous DRAM) implement a DLL (Delay Locked Loop) circuit for synchronization of output timing of read data with an external clock signal. By using the DLL circuit, the phase of a controlling clock signal for controlling a data output circuit is adjusted to the phase of the external clock signal so that read data is output in synchronization with the external clock signal. The basic configuration of the DLL circuit has been disclosed, for example, in Japanese Unexamined Patent Application Publication No. Hei 10-112182.

Figure 1:
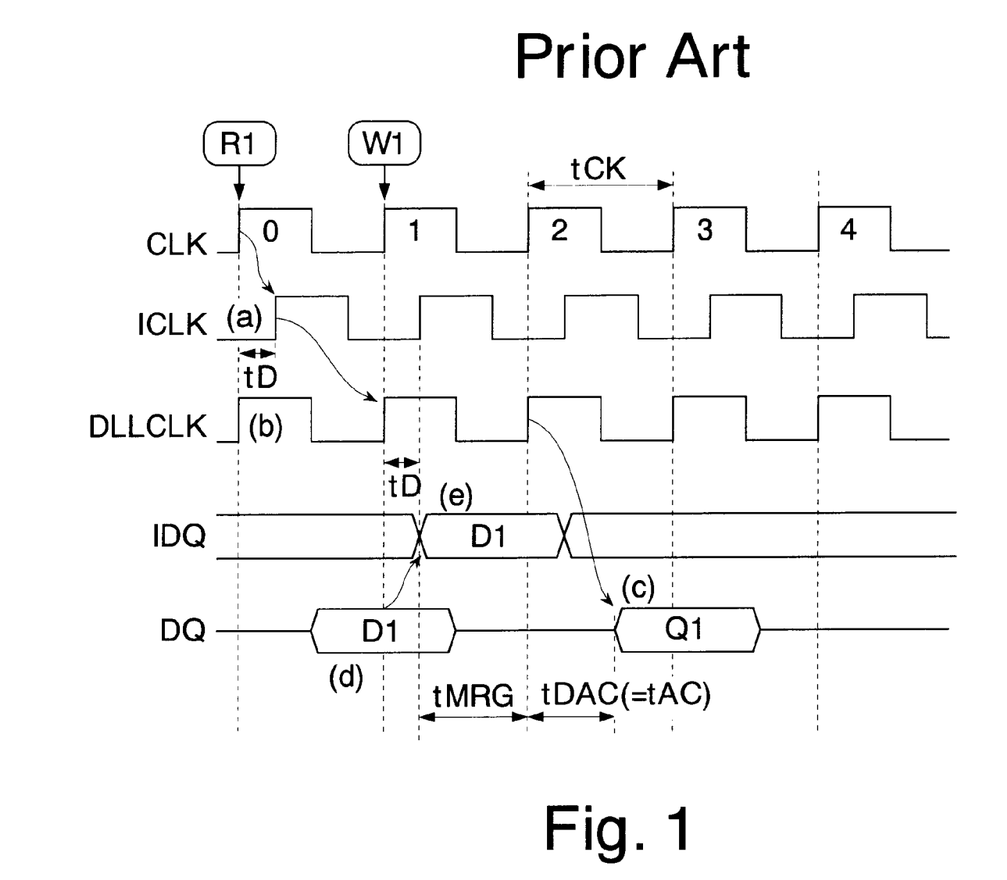
FIG. 1 is a timing chart showing the operation of an SDRAM having a conventional DLL circuit.

FIG. 1 shows the operation of an SDRAM having a DLL circuit. The SDRAM receives an external clock signal CLK with its clock buffer, and generates an internal clock signal ICLK (FIG. 1(a)). The internal clock signal ICLK lags behind the external clock signal CLK by a delay time tD of the clock buffer. The delay time tD is a fixed time independent of the frequency of the external clock signal CLK. The SDRAM also generates an adjusted clock signal DLLCLK having the same phase as that of the external clock signal CLK, by using the internal clock signal ICLK (FIG. 1(b)).

In this example, the SDRAM receives a read command R1 in association with the zeroth external clock signal CLK and receives a write command W1 in association with the first external clock signal CLK.

A data output circuit outputs read data Q1 corresponding to the read command R1 to a data terminal DQ in synchronization with the rising edge of the adjusted clock signal DLLCLK that corresponds to the second external clock signal CLK (FIG. 1(c)). That is, the read data Q1 is output as lagging behind the rising edge of the second external clock signal by a delay time tDAC of the data output circuit (read latenc=2). Consequently, the access time tAC with respect to the external clock signal CLK is equal to the delay time tDAC. The system on which the SDRAM is mounted receives the read data Q1 in synchronization with the rising edge of the third external clock signal CLK.

Meanwhile, write data D1 corresponding to the write command W1 is supplied in time with the rising edge of the first external clock signal CLK, along with the write command W1 (FIG. 1(d)). This operation is referred to as an operation of write latency "0". A data input circuit receives the write data D1 in synchronization with the rising edge of the internal clock signal ICLK, and outputs it as internal data IDQ (FIG. 1(e)). The internal data IDQ (D1) is thus transmitted to the internal circuit as lagging behind the external clock signal CLK by the delay time tD of the clock buffer. Subsequently, the write data D1 is amplified by a write amplifier and written to memory cells by sense amplifiers via an internal data bus.

When the memory cells for the read data Q1 to be read from and the memory cells for the write data D1 to be written to are the same, the output of the read data Q1 might be delayed if the write data D1 is written to the memory cells before the written data is read from the memory cells. To avoid access delay, SDRAMs of this type have an address comparator. Then, the address comparator compares the read address and the write address, and outputs the write data D1 as the read data Q1 directly if the two addresses are the same.

Here, in order to output the read data Q1 with the latency "2", the comparison of the addresses and the selection of the read data in accordance with the comparison result must be completed between when the internal data IDQ (D1) is output and when the data output circuit starts to operate. More specifically, the comparison of the addresses and the selection of the read data must be completed within a margin time tMRG which elapses from the rising edge of the first internal clock signal ICLK to the rising edge of the second external clock signal CLK (adjusted clock signal DLLCLK).

Recent SDRAMs require operating frequencies of up to 250 MHz (clock cycle tCK=4 ns). For example, given that the clock cycle tCK is 4 ns and the operating delay of the clock buffer is 2 ns, the margin time tMRG must be less than or equal to 2 ns. If the margin time tMRG exceeds 2 ns, the clock cycle tCK needs to be extended in accordance with the margin time tMRG. That is, the maximum clock frequency can be restricted by the margin time tMRG.

The foregoing problem is not limited to the case shown in FIG. 1 where the read command R1 and the write command W1 are input successively. In general, the problem is common to situations where read data Q1 is output in synchronization with the clock next to the one at which write data D1 is received.

SUMMARY OF THE INVENTION

It is an object of the present invention to secure an operating margin for the internal circuit of a semiconductor memory device in order to increase a frequency of a clock signal.

According to one of the aspects of the semiconductor memory device of the present invention, a phase adjustment circuit delays an external clock signal by a predetermined amount to generate an adjusted clock signal. A phase comparator compares phases of the external clock signal and the adjusted clock signal, and outputs a phase adjustment signal to adjust a delay time of the phase adjustment circuit in accordance with the comparison result. A data output circuit outputs read data from the memory cell array to a data terminal in synchronization with the adjusted clock signal. A data input circuit receives write data written to the memory cell array in synchronization with the adjusted clock signal, the write data also being supplied to the data terminal. That is, the data output circuit and the data input circuit operate in synchronization with the same adjusted clock signal.

The cycle of the adjusted clock signal is the same as that of the external clock signal. Consequently, when the input of the write data and the output of the read data are performed in succession, the switching control between the input operation of the write data and the output operation of the read data only has to be completed within one clock cycle. In other words, the clock cycle can be reduced to the time required for the foregoing switching control. As a result, it is possible to prevent the maximum frequency of the external clock signal from being restricted by the time required for the switching control. The external clock signal can thus be increased in maximum frequency.

According to another aspect of the semiconductor memory device of the present invention, an address terminal receives a write address to select a memory cell to which data is written and a read address to select a memory cell from which data is read. An address comparator compares the write address and the read address received by the address terminal. A data selecting circuit outputs write data supplied in correspondence with the write address to the data output circuit, the write data outputted as read data corresponding to the read address, when result of the comparison by the address comparator indicates that the write address and the read address coincide with each other.

As stated above, the operation from the input of the write data to the output of the read data only has to be completed within one clock cycle. Consequently, the margin time necessary for the address comparison in the address comparator and for the data selection in the data selecting circuit can be extended to one clock cycle. When the clock cycle is restricted by the margin time, this restriction can be relaxed accordingly. That is, the maximum frequency of the external clock signal can be increased for an improved data transmission rate.

According to another aspect of the semiconductor memory device of the present invention, the phase adjustment circuit generates the adjusted clock signal which is in the same phase with the external clock signal. Consequently, the semiconductor memory device can receive the write data and output the read data completely in synchronization with the external clock signal. In other words, the system on which the semiconductor memory device is mounted only has to output the write data in synchronization with the external clock signal generated by the system itself, while surely receiving the read data in synchronization with the external clock signal.

According to another aspect of the semiconductor memory device of the present invention, the phase adjustment circuit generates the adjusted clock signal leading the external clock signal in phase. It is therefore possible to output the read data earlier than synchronizing the read data to the external clock signal, with a reduction in the access time in read operation.

According to another aspect of the semiconductor memory device of the present invention, a variable delay circuit adjusts a phase of the external clock signal or a phase of the adjusted clock signal to be compared by the phase comparator, in accordance with a command signal supplied to an external terminal. Thus, adjusting the phases of the clock signals in accordance with the electric characteristics of the semiconductor memory device allows characteristic defects to be relieved. This results in an enhanced fabrication yield.

According to another aspect of the semiconductor memory device of the present invention, a variable delay circuit adjusts a phase of the external clock signal or a phase of the adjusted clock signal to be compared by the phase comparator, in accordance with a command signal. A fuse circuit outputs the command signal for setting a delay time of the variable delay circuit. In accordance with the electric characteristics of the semiconductor memory device, the fuse circuit can be programmed to adjust the phases of the clock signals, thereby relieving characteristic defects. This results in an enhanced fabrication yield.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 2:
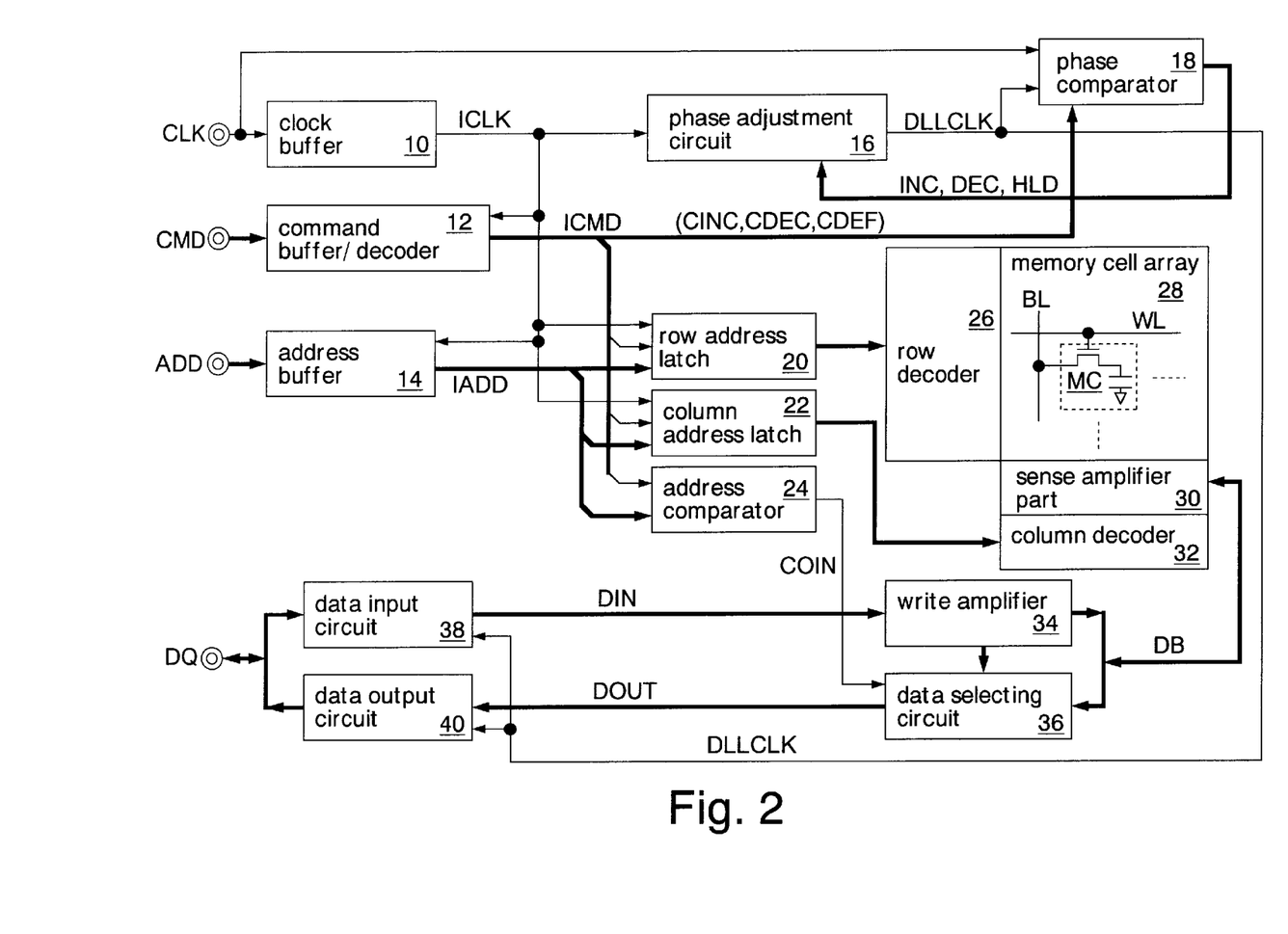
FIG. 2 is a block diagram showing a first embodiment of the present invention.

FIG. 2 shows a first embodiment of the semiconductor memory device of the present invention. This semiconductor memory device is formed as an SDRAM on a silicon substrate by using CMOS processes. In the diagram, each thick line represents a signal line that consists of a plurality of bits. The double circles shown to the left in the diagram represent external terminals.

The SDRAM comprises a clock buffer 10, a command buffer/decoder 12, an address buffer 14, a phase adjustment circuit 16, a phase comparator 18, a row address latch 20, a column address latch 22, an address comparator 24, a row decoder 26, a memory cell array 28, a sense amplifier part 30, a column decoder 32, a write amplifier 34, a data selecting circuit 36, a data input circuit 38, and a data output circuit 40.

The clock buffer 10 receives an external clock signal CLK, and outputs the received signal as an internal clock signal ICLK. The external clock signal CLK is a system clock generated by the system on which the SDRAM is mounted.

The command buffer/decoder 12 receives a command signal CMD in synchronization with the internal clock signal ICLK, decodes the received signal, and outputs the decoding result as an internal command signal ICMD. Command signals CMD to be supplied include an increment command, decrement command, and default command for adjusting the phase of an adjusted clock signal DLLCLK to be described later, aside from a write command, a read command, a NOP command, etc.

The command buffer/decoder 12, when supplied with the increment command, decrement command, and default command, outputs command signals CINC, CDEC, and CDEF, respectively. One of the command signals CINC, CDEC, and CDEF decoded is changed to high level, and kept at high level until another command signal is received.

That is, the command buffer/decoder 12 has the function of a mode register for setting the operation mode.

The address buffer 14 receives an address signal ADD supplied to an address terminal in synchronization with the internal clock signal ICLK, and outputs the received signal as an internal address signal IADD. The address signal ADD is supplied to the address terminal in the form of a row address and a column address separately.

The phase adjustment circuit 16 adjusts the phase of the internal clock signal ICLK, and outputs the adjusted signal as the adjusted clock signal DLLCLK. The phase adjustment circuit 16 delays the phase of the adjusted clock signal DLLCLK upon receiving an increment signal INC from the phase comparator 18, advances the phase of the adjusted clock signal DLLCLK upon receiving a decrement signal DEC, and fixes the phase of the adjusted clock signal DLLCLK upon receiving a hold signal HLD. That is, the increment signal INC, the decrement signal DEC, and the hold signal HLD are phase adjustment signals for adjusting the phase of the phase adjustment circuit 16.

Figure 3:
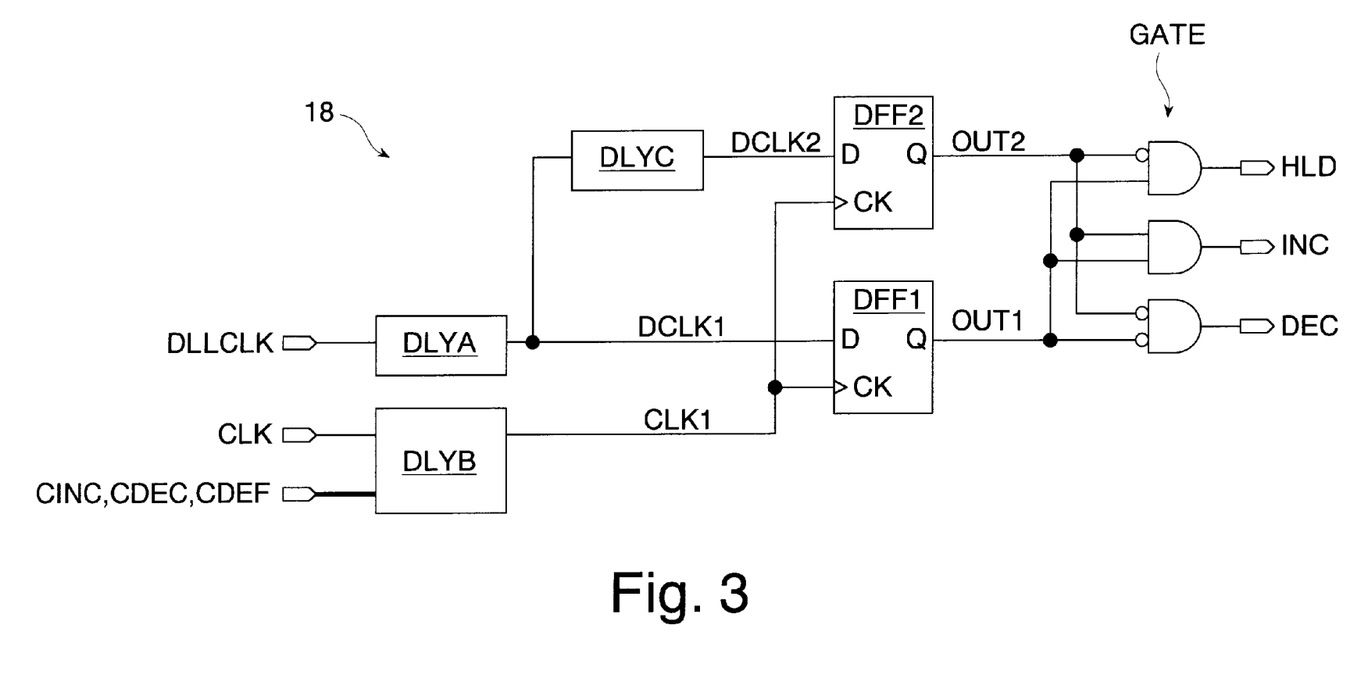
FIG. 3 is a circuit diagram showing the details of the phase comparator of FIG. 2.

The phase comparator 18 compares the external clock signal CLK and the adjusted clock signal DLLCLK in phase. The phase comparator 18 outputs the increment signal INC when the phase of the adjusted clock signal DLLCLK leads the phase of the external clock signal CLK. The phase comparator 18 outputs the decrement signal DEC when the phase of the adjusted clock signal DLLCLK lags behind the phase of the external clock signal CLK. The phase comparator 18 outputs the hold signal HLD when the difference between the phase of the adjusted clock signal DLLCLK and the phase of the external clock signal CLK falls below a predetermined amount. The phase comparator 18 also has a variable delay circuit DLYB for delaying the external clock signal CLK, as shown in FIG. 3 to be seen later. The delay time of the variable delay circuit DLYB is adjusted in accordance with the command signals CINC, CDEC, and CDEF from the command buffer/decoder 12.

The row address latch 20 latches the internal address signal IADD (row address) in synchronization with the internal clock signal ICLK when it receives an internal command signal ICMD indicating a row operation, and outputs the latched address to the row decoder 26. The column address latch 22 latches the internal address signal IADD (column address) in synchronization with the internal clock signal ICLK when it receives an internal command signal ICMD indicating a column operation, and outputs the latched address to the column decoder 32.

The address comparator 24 compares two address signals ADD supplied successively in association with command signals CMD, and if the address signals ADD coincide with each other, outputs a coincidence signal COIN to the data selecting circuit 36.

The memory cell array 28 has a plurality of volatile memory cells MC arranged in a matrix, as well as a plurality of word lines WL and a plurality of bit lines BL connected to the memory cells MC. The memory cells MC each have a capacitor for retaining data as a charge and a transfer transistor arranged between this capacitor and a bit line BL. The gate of the transfer transistor is connected to a word line WL.

The row decoder 26 decodes the row address from the row address latch 20 to select word lines WL of the memory cell array 28. The column decoder 32 decodes the column address from the column address latch 22 to select column switches for establishing connection between bit lines BL and an internal data bus DB. The sense amplifier part 30 has a plurality of sense amplifiers and a plurality of column switches which are connected to the bit lines BL. The sense amplifiers amplify the signal values of data that is read from the memory cells to the bit lines BL, and output the resultant as read data to the internal data bus DB via the column switches. Moreover, the sense amplifiers hold the signal values of write data transmitted from the internal data bus DB to the bit lines BL via the column switches.

The write amplifier 34, in write operations, outputs write data DIN from the data input circuit 38 to the internal data bus DB. The data selecting circuit 36, in read operations, outputs data read from the memory cell array 28 as read data DOUT. Now, when it receives the coincidence signal COIN, the data selecting circuit 36 will not output the data from the memory cell array 28 but output the write data held in the write amplifier 34 as the read data DOUT.

The data input circuit 38 is activated in write operations. It receives the write data supplied to a data terminal DQ in synchronization with the adjusted clock signal DLLCLK, and outputs the received data as the write data DIN. The data output circuit 40 is activated in read operations. It outputs the read data DOUT output from the data selecting circuit 36 to the data terminal DQ. That is, in the present invention, not only the data output circuit 40 but also the data input circuit 38 operates in synchronization with the adjusted clock signal DLLCLK.

FIG. 3 shows the details of the phase comparator 18 shown in FIG. 2. The phase comparator 18 has delay circuits DLYA, DLYB, and DLYC, D flip-flops DFF1 and DFF2, and a logic gate. The delay circuit DLYA delays the adjusted clock signal DLLCLK, and outputs the resultant as a delayed clock signal DCLK1. The delay circuit DLYB delays the external clock signal CLK in accordance with the command signals CINC, CDEC, and CDEF, and outputs the resultant as a delayed clock signal CLK1. That is, the delay circuit DLYB operates as a variable delay circuit. The delay circuit DLYC delays the delayed clock signal DCLK1, and outputs the-resultant as a delayed clock signal DCLK2. The phase comparator 18, as will be described later, determines that the phase of the external clock signal CLK and the phase of the adjusted clock signal DLLCLK coincide with each other when the phase difference between the two clock signals falls below the delay time of the delay circuit DLYC.

The D flip-flop DFF1 latches the delayed clock signal DCLK1 in synchronization with the delayed clock signal DCLK1, and outputs it as an output signal OUT1. The D flip-flop DFF2 latches the delayed clock signal DCLK2 in synchronization with the delayed clock signal CLK1, and outputs it as an output signal OUT2. Then, according to the logic of the output signals OUT1 and OUT2, the logic gate GATE outputs any one of the hold signal HLD, increment signal INC, and decrement signal DEC.

Figure 4:
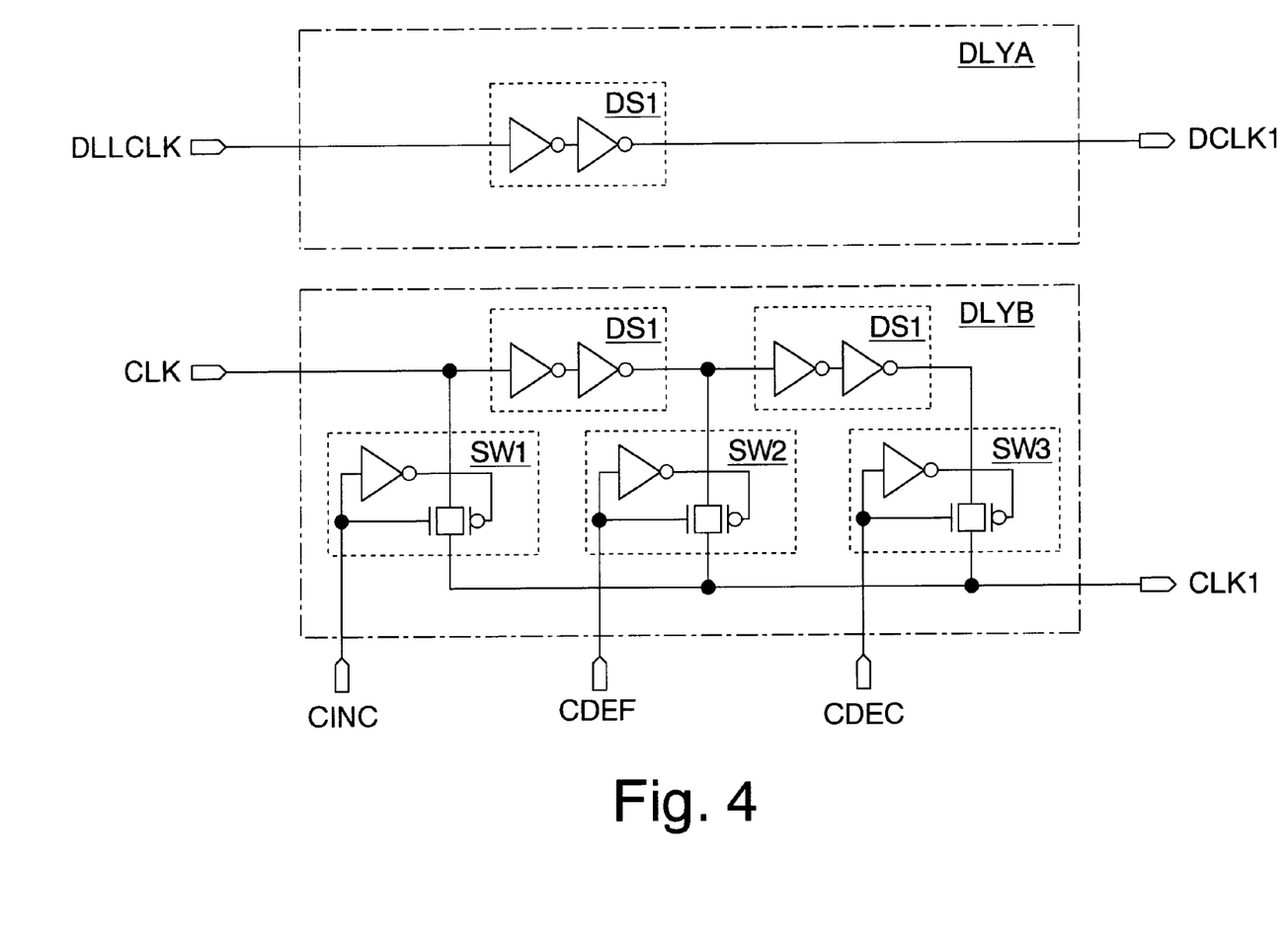
FIG. 4 is a circuit diagram showing the details of delay circuits of FIG. 3.

FIG. 4 shows the details of the delay circuits DLYA and DLYB shown in FIG. 3.

The delay circuit DLYA has a delay stage DS1 which consists of two CMOS inverters connected in series. The delay circuit DLYB has two delay stages DS1 connected in series, and three switch circuits SW1, SW2, and SW3 for connecting the input nodes and output nodes of these delay stages DS1 to the output node of the delayed clock signal CLK1, respectively. The switch circuits SW1, SW2, and SW3 have CMOS transmission gates and inverters that receive the command signals CINC, CDEF, and CDEC for controlling the transmission gates, respectively.

The switch circuit SW1 is turned on when the command signal CINC is at high level, so that the external clock signal CLK is transmitted as the delayed clock signal CLK1. The switch circuit SW2 is turned on when the command signal CDEF is at high level, so that the external clock signal CLK delayed by one delay stage DS1 is transmitted as the delayed clock signal CLK1. The switch circuit SW3 is turned on when the command signal CDEC is at high level, so that the external clock signal CLK delayed by the two delay stages DS1 is transmitted as the delayed clock signal CLK1.

Figure 5:
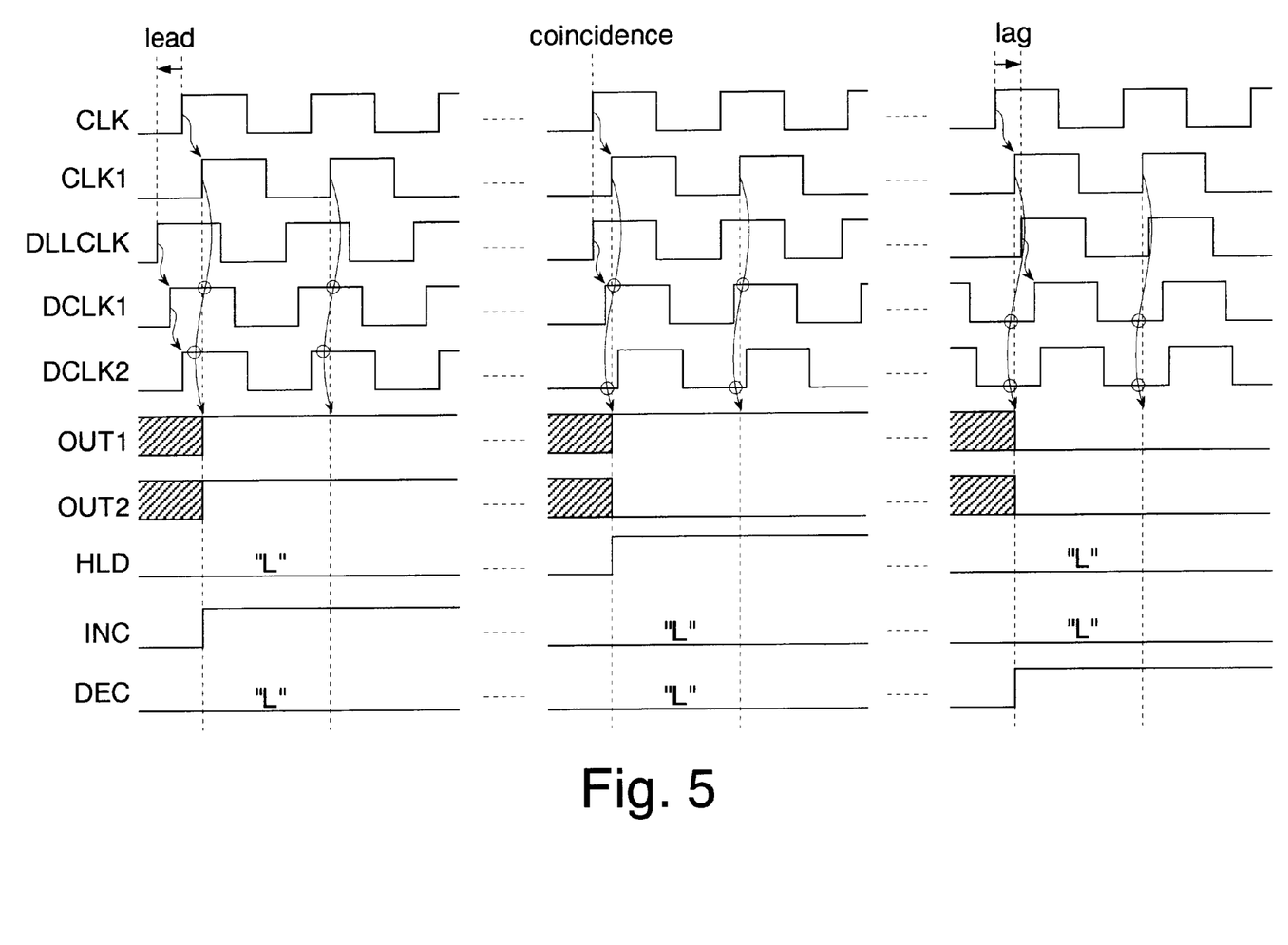
FIG. 5 is a timing chart showing the operation of the phase comparator of FIG. 2.

FIG. 5 shows the operation of the phase comparator 18 shown in FIG. 3. In this example, the command signal CDEF out of the command signals CINC, CDEC, and CDEF is exclusively changed to high level. That is, the delayed clock signal CLK1 lags behind the external clock signal CLK by the delay time of the delay stage DS1 shown in FIG. 4. The delayed clock signal DCLK1 lags behind the adjusted clock signal DLLCLK by the delay time of the delay stage DS1. That is, the delay time of the delayed clock signal CLK1 with respect to the external clock signal CLK is equal to the delay time of the delayed clock signal DCLK1 with respect to the adjusted clock signal DLLCLK. The delayed clock signal CLK1 further lags as much as the delay time of the switch circuit SW2 in fact. Consequently, the phase of the delayed clock signal CLK1 lags slightly behind the phase of the delayed clock signal DCLK1.

When the phase of the adjusted clock signal DLLCLK leads the phase of the external clock signal CLK (the left in the diagram) and the D flip-flops DFF1 and DFF2 shown in FIG. 3 latch the delayed clock signals DCLK1 and DCLK2 of high level, respectively, the output signals OUT1 and OUT2 both change to high level. Here, the increment signal INC for indicating a phase lead changes to high level.

If the phase of the adjusted clock signal DLLCLK is almost the same as that of the external clock signal CLK (the center in the diagram) when the D flip-flop DFF1 latches the delayed clock signal DCLK1 of high level and the D flip-flop DFF2 the delayed clock signal DCLK2 of low level, the output signals OUT1 and OUT2 change to high level and low level, respectively. Here, the hold signal HLD for indicating a phase coincidence changes to high level.

When the phase of the adjusted clock signal DLLCLK lags behind the phase of the external clock signal CLK (the right in the diagram) and the D flip-flops DFF1 and DFF2 latch the delayed clock signals DCLK1 and DCLK2 of low level, the output signals OUT1 and OUT2 both change to low level. Here, the decrement signal DEC for indicating a phase lag changes to high level. Then, the phase adjustment circuit 16 shown in FIG. 2 adjusts the phase of the adjusted clock signal DLLCLK in accordance with the signals INC, HLD, and DEC.

Figure 6:
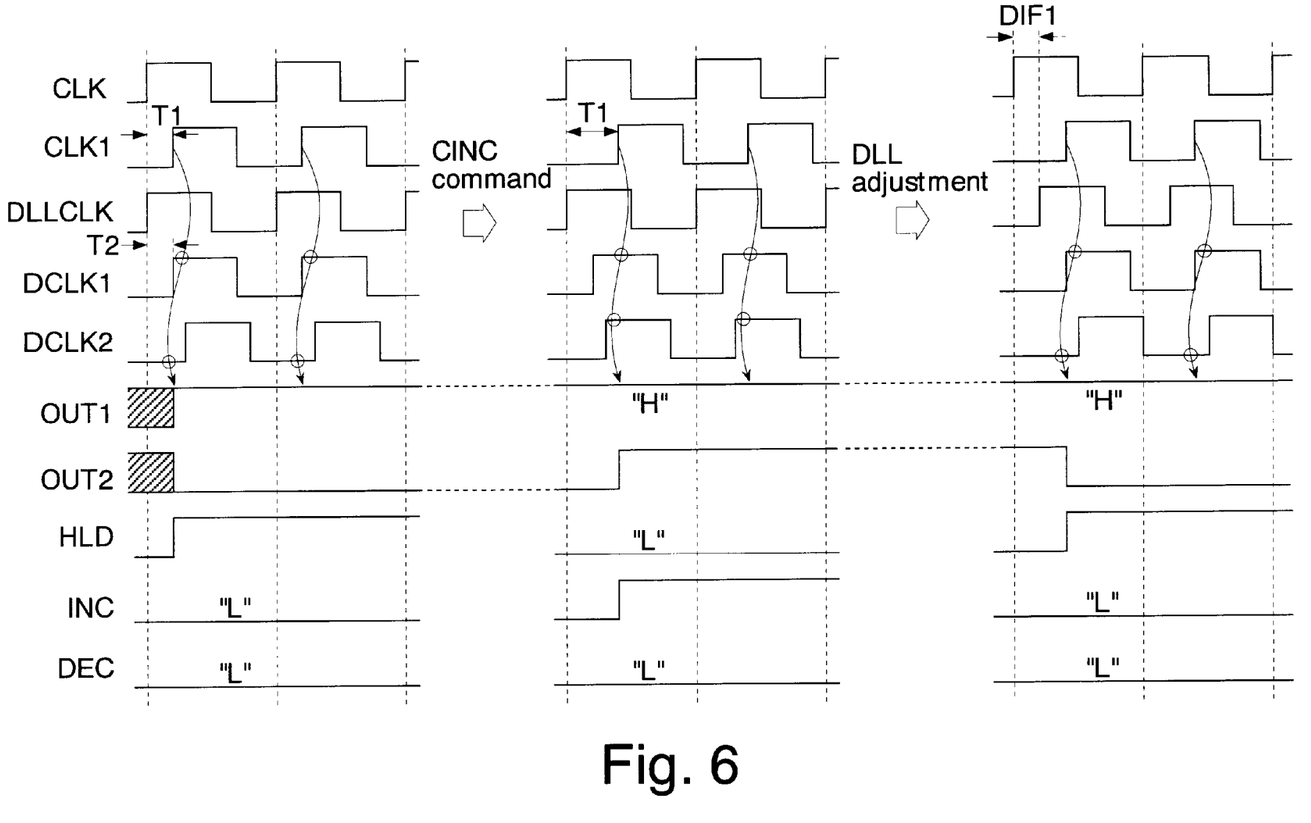
FIG. 6 is a timing chart showing the operation of the phase adjustment circuit in receiving an increment command.

FIG. 6 shows the operation of the phase comparator 18 for situations where the increment command is supplied to change the command signal CINC to high level.

In the initial state (the timing chart shown to the left in the diagram), the command buffer/decoder 12 is set with the default command CDEF. As described in conjunction with FIG. 4, the delay time T1 of the delayed clock signal CLK1 with respect to the external clock signal CLK is nearly equal to the delay time T2 of the delayed clock signal DCLK1 with respect to the adjusted clock signal DLLCLK. The phase comparator 18 thus outputs the hold signal HLD when the phase of the adjusted clock signal DLLCLK coincides with the phase of the external clock signal CLK.

In this state, the increment command is supplied from the exterior of the SDRAM so that the command signal CINC changes to high level. The delay circuit DLYB shown in FIG. 4 increases the delay time T1 of the delayed clock signal CLK1 with respect to the external clock signal CLK as much as the delay time of the delay stage DS1. As shown in the timing chart at the center of the diagram, the latching timing of the D flip-flops DFF1 and DFF2 shown in FIG. 3 lags accordingly. Consequently, the output signals OUT1 and OUT2 both become high level when the phase of the adjusted clock signal DLLCLK coincides with the phase of the external clock signal CLK. That is, the phase comparator 18 outputs the increment signal INC.

Next, in the timing chart shown to the right in the diagram, the phase adjustment circuit 16 shown in FIG. 2 delays the phase of the adjusted clock signal DLLCLK in accordance with the increment signal INC. Then, when the phase of the adjusted clock signal DLLCLK gets behind the phase of the external clock signal CLK by a difference DIF1, the phase comparator 18 outputs the hold signal HLD again, determining that the phases coincide with each other. In this way, under the increment command (CINC) from the exterior of the. SDRAM, the phase of the adjusted clock signal DLLCLK can be made to lag behind the phase of the external clock signal CLK (DLL adjustment).

Figure 7:
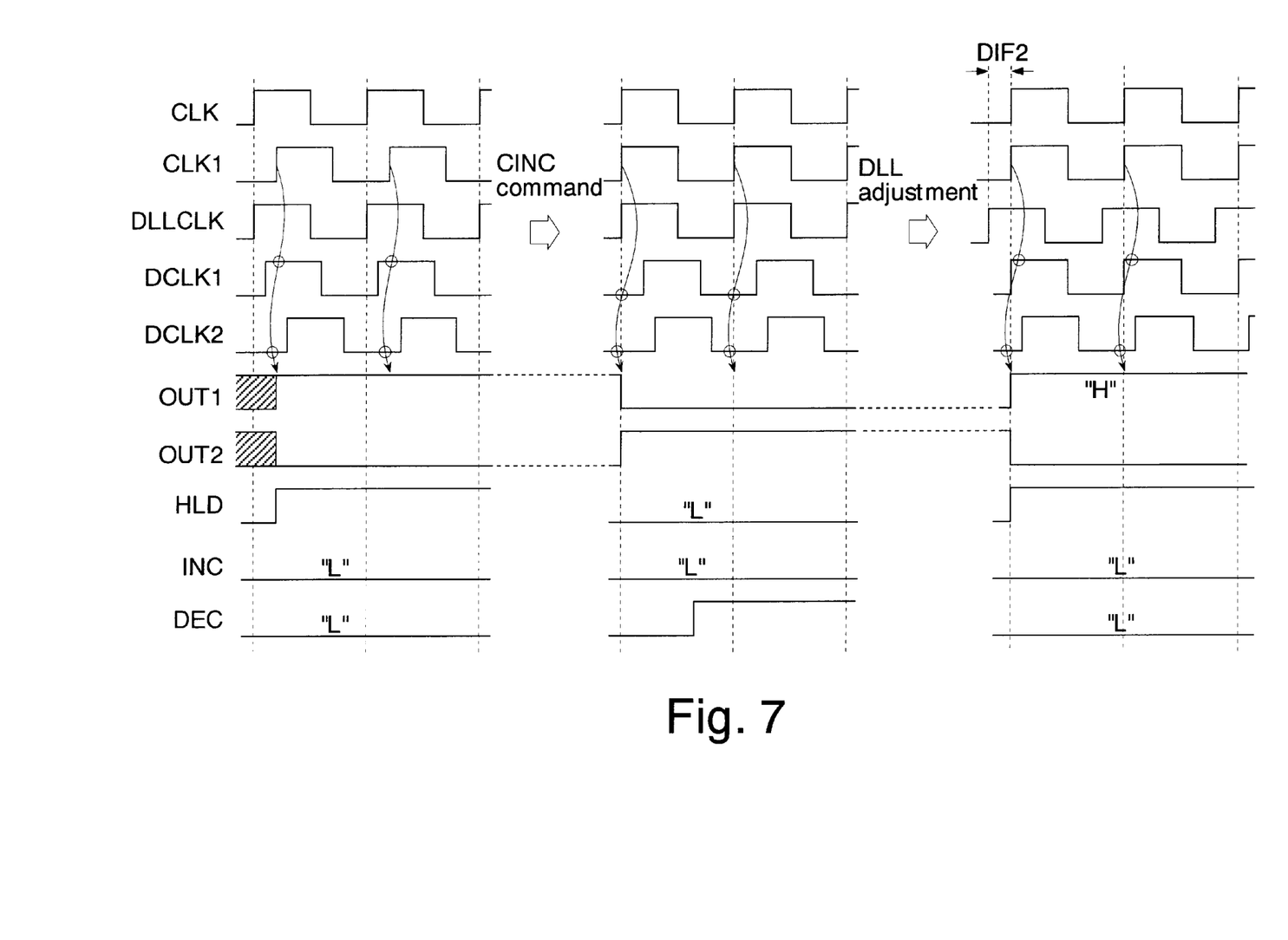
FIG. 7 is a timing chart showing the operation of the phase adjustment circuit in receiving a decrement command.

FIG. 7 shows the operation of the phase comparator 18 for situations where the decrement command is supplied to change the command signal CDEC to high level. Detailed description will be omitted of the same operation as in FIG. 6.

In the initial state (the timing chart shown to the left in the diagram), the command buffer/decoder 12 is set with the default command CDEF. The phase comparator 18 outputs the hold signal HLD when the phase of the adjusted clock signal DLLCLK coincides with the phase of the external clock signal CLK.

In this state, the decrement command is supplied from the exterior of the SDRAM so that the command signal CDEC changes to high level. As shown in the timing chart at the center of the diagram, the delay circuit DLYB eliminates the phase difference of the delayed clock signal CLK1 to the external clock signal CLK. This advances the latching timing of the D flip-flops DFF1 and DFF2. Consequently, the output signals OUT1 and OUT2 change to low level and high level, respectively, so that the decrement signal DEC is output.

Next, in the timing chart shown to the right in the diagram, the phase adjustment circuit 16 shown in FIG. 2 advances the phase of the adjusted clock signal DLLCLK in accordance with the decrement signal DEC. Then, when the phase of the adjusted clock signal DLLCLK gets ahead of the phase of the external clock signal CLK by a difference DIF2, the phase comparator 18 outputs the hold signal HLD again, determining that the phases coincide with each other. In this way, under the decrement command (CDEC) from the exterior of the SDRAM, the phase of the adjusted clock signal DLLCLK can be made to lead the phase of the external clock signal CLK (DLL adjustment).

Figure 8:
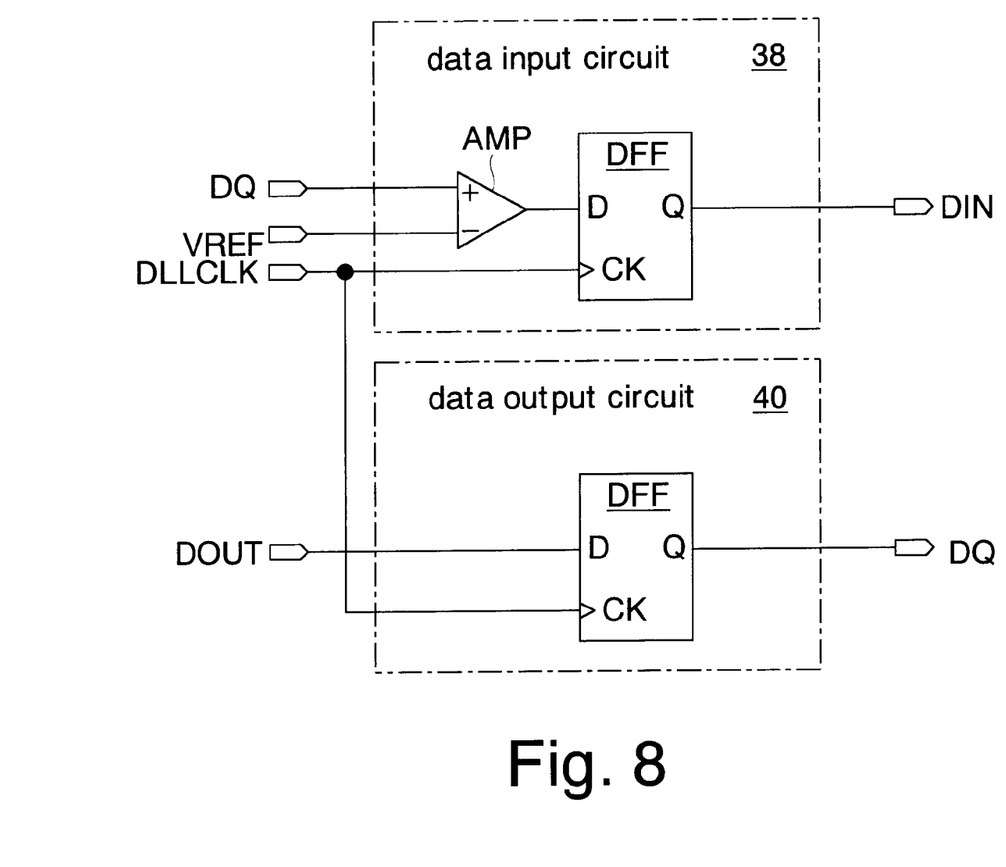
FIG. 8 is a circuit diagram showing the data input circuit and the data output circuit of FIG. 2.

FIG. 8 shows the details of the data input circuit 38 and the data output circuit 40 shown in FIG. 2.

The data input circuit 38 has a differential amplifier AMP and a D flip-flop DFF. The differential amplifier AMP amplifies a voltage difference between the data signal supplied through the data terminal DQ and a reference voltage VREF. The D flip-flop DFF latches the data signal output from the differential amplifier AMP in synchronization with the adjusted clock signal DLLCLK, and outputs the latched signal as the write data DIN.

The data output circuit 40 latches the read data DOUT output from the data selecting circuit 36 in synchronization with the adjusted clock signal DLLCLK, and outputs the latched signal to the data terminal DQ.

Figure 9:
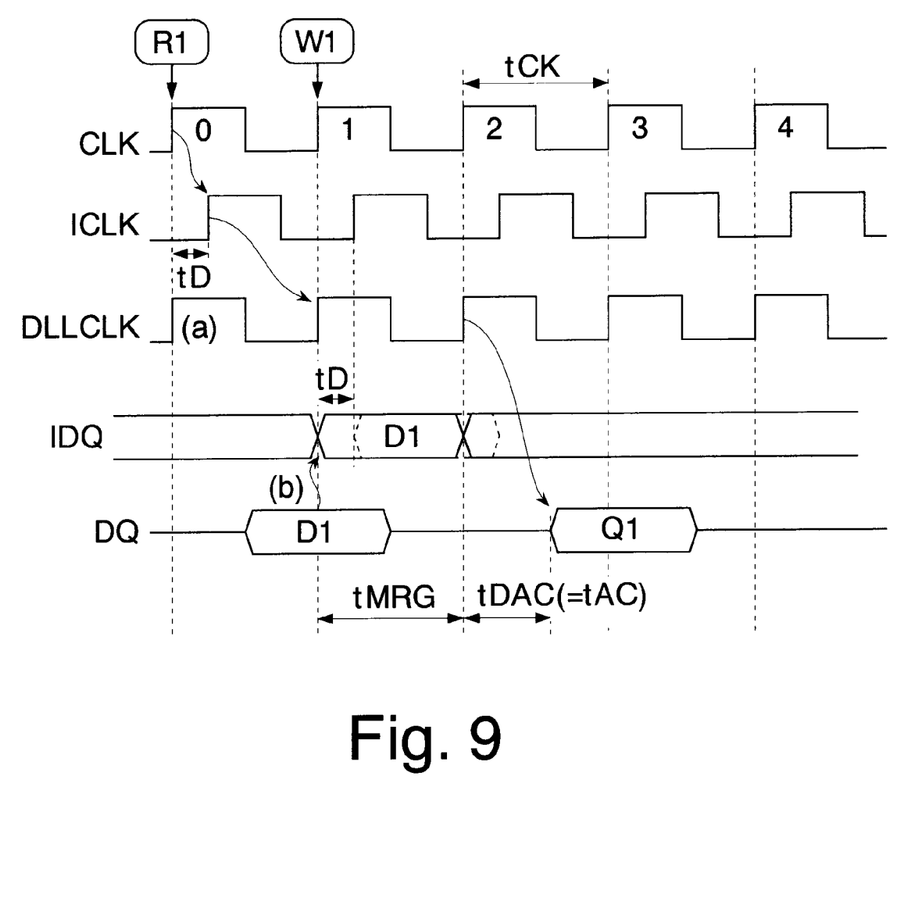
FIG. 9 is a timing chart showing an operation of the SDRAM in the first embodiment.

FIG. 9 shows an operation of the SDRAM according to the present invention. Detailed description will be omitted of the same operation as in FIG. 1 seen above. In this example, the default command CDEF is held in the command buffer/decoder 12. As in FIG. 1, the SDRAM receives a read command R1 in association with the zeroth external clock signal CLK and receives a write command W1 in association with the first external clock signal CLK. The read latency is "2", and the write latency is "0".

In this example, the phase of the adjusted clock signal DLLCLK coincides with the phase of the external clock signal CLK (FIG. 9(a)). The data input circuit 38 thus receives write data D1 in synchronization with the rising edge of the external clock signal CLK (FIG. 9(b)). In the chart, the internal data signal IDQ shown in broken lines indicates the conventional reception timing. The reception timing of the write data D1 is earlier than heretofore (FIG. 1) by a delay time tD of the clock buffer 10.

Now, if the read address corresponding to the read command R1 and the write address corresponding to the write command W1 are the same, the SDRAM must output the write data W1 yet to be written to the memory cells MC as the read data Q1 so that the read latency "2" is secured. Here, the comparing operation of the read address and write address by the address comparator 24 shown FIG. 2 and the selecting operation of the read data by the data selecting circuit 36 in accordance with the coincidence signal COIN may be performed during the margin time tMRG from the rising edge of the first external clock signal CLK to the rising edge of the second external clock signal CLK. That is, the margin time tMRG becomes longer than heretofore by the delay time tD.

For example, given that the clock cycle tCK is 4 ns (250 MHz) and the delay time tD of the clock buffer 10 is 2 ns, the margin time tMRG is 4 ns, i.e., twice the conventional. The increased margin time tMRG allows the clock cycle tCK to be reduced without being restricted by the margin time tMRG. That is, the maximum frequency of the external clock signal CLK is prevented from being restricted by the margin time tMRG.

Figure 10:
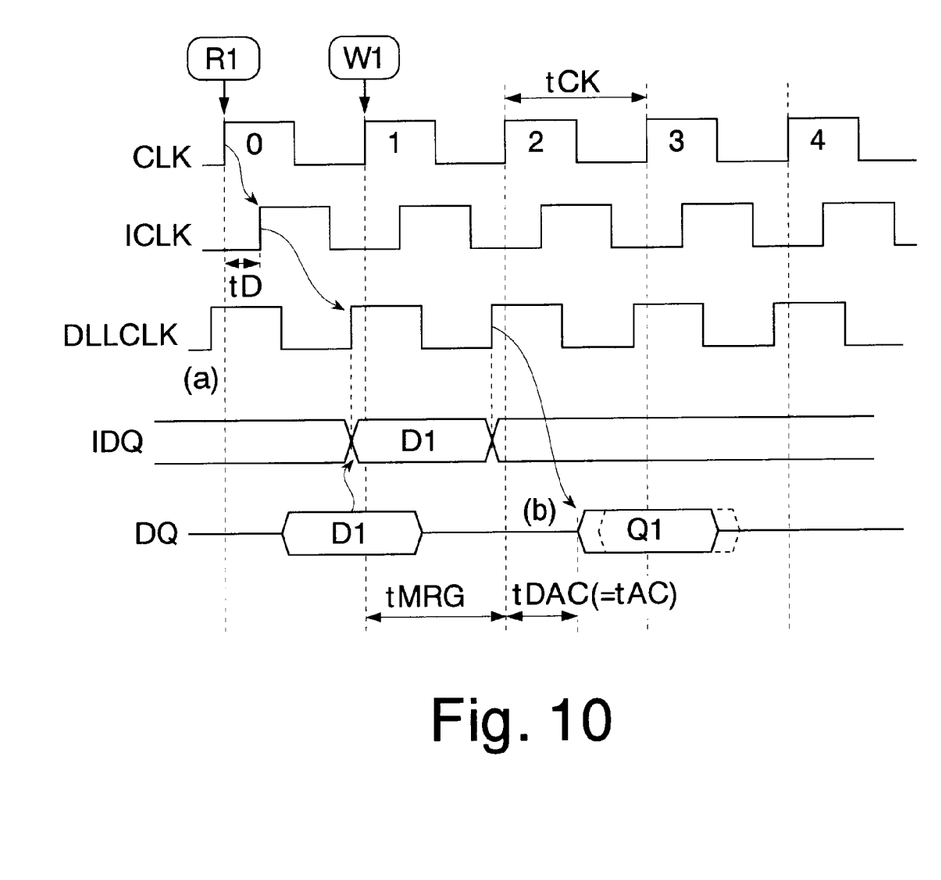
FIG. 10 is a timing chart showing another operation of the SDRAM in the first embodiment.

FIG. 10 shows another operation of the SDRAM according to the present invention. Detailed description will be omitted of the same operation as in FIG. 1 seen above.

In this example, the decrement command CDEC is held in the command buffer/decoder 12. As shown in FIG. 7, the phase of the adjusted clock signal DLLCLK thus leads the phase of the external clock signal CLK (FIG. 10(a)). The leading phase of the adjusting clock signal DLLCLK makes the reception timing of the write data D1 and the output timing of the read data Q1 earlier than in FIG. 9 (FIG. 10(b)). Consequently, the access time tAC with respect to the external clock signal CLK can be reduced while the margin time tMRG is kept at the clock cycle tCK. In the chart, the data signal DQ shown in broken lines indicates the conventional output timing.

Incidentally, the phase of the adjusted clock signal DLLCLK can be adjusted in the range where the rising edge of the third external clock signal CLK falls within the output period of the read data Q1. Here, the number of delay stages DS1 of the delay circuit DLYB shown in FIG. 4 and the number of bits of the command signals can be increased for finer adjustment to the adjusted clock signal DLLCLK.

As has been described, in the present embodiment, the data input circuit 38 and the data output circuit 40 are both operated in synchronization with the adjusted clock signal DLLCLK. Consequently, when the input of the write data D1 and the output of the read data Q1 are successively performed on the same memory cells, the margin time necessary for the address comparison in the address comparator 24 and the data selection in the data selecting circuit 36 can be extended to a single clock cycle tCK. In other words, the clock cycle tCK can be reduced to the foregoing margin time. As a result, the maximum frequency of the external clock signal CLK can be increased for an improved data transmission rate. In particular, the system on which the SDRAM is mounted can be improved in performance if the external clock signal CLK is the system clock thereof.

In accordance with the command signal CMD supplied to the command terminal CMD, the delay time of the variable delay circuit DLYB is adjusted to adjust the phase of the adjusted clock signal DLLCLK which is subjected to the comparison in the phase comparator 18. For example, the phase adjustment circuit 16 can generate the adjusted clock signal DLLCLK having the same phase as that of the external clock signal CLK so that the SDRAM receives the write data D1 and outputs the read data Q1 in complete synchronization with the external clock signal CLK. As a result, the system on which the SDRAM is mounted has only to output the write data D1 in synchronization with the external clock signal CLK generated by itself, while surely receiving the read data Q1 in synchronization with the external clock signal CLK.

Moreover, the phase adjustment circuit 16 can generate the adjusted clock signal DLLCLK leading the external clock signal CLK in phase so that the read data Q1 is output earlier than in synchronization with the external clock signal CLK. As a result, it is possible to reduce the access time tAC in read operations. That is, in accordance with the electric characteristics of the SDRAM, the phase of the adjusted clock signal DLLCLK can be adjusted to relieve operation defects (AC defects). This results in an enhanced fabrication yield.

Figure 11:
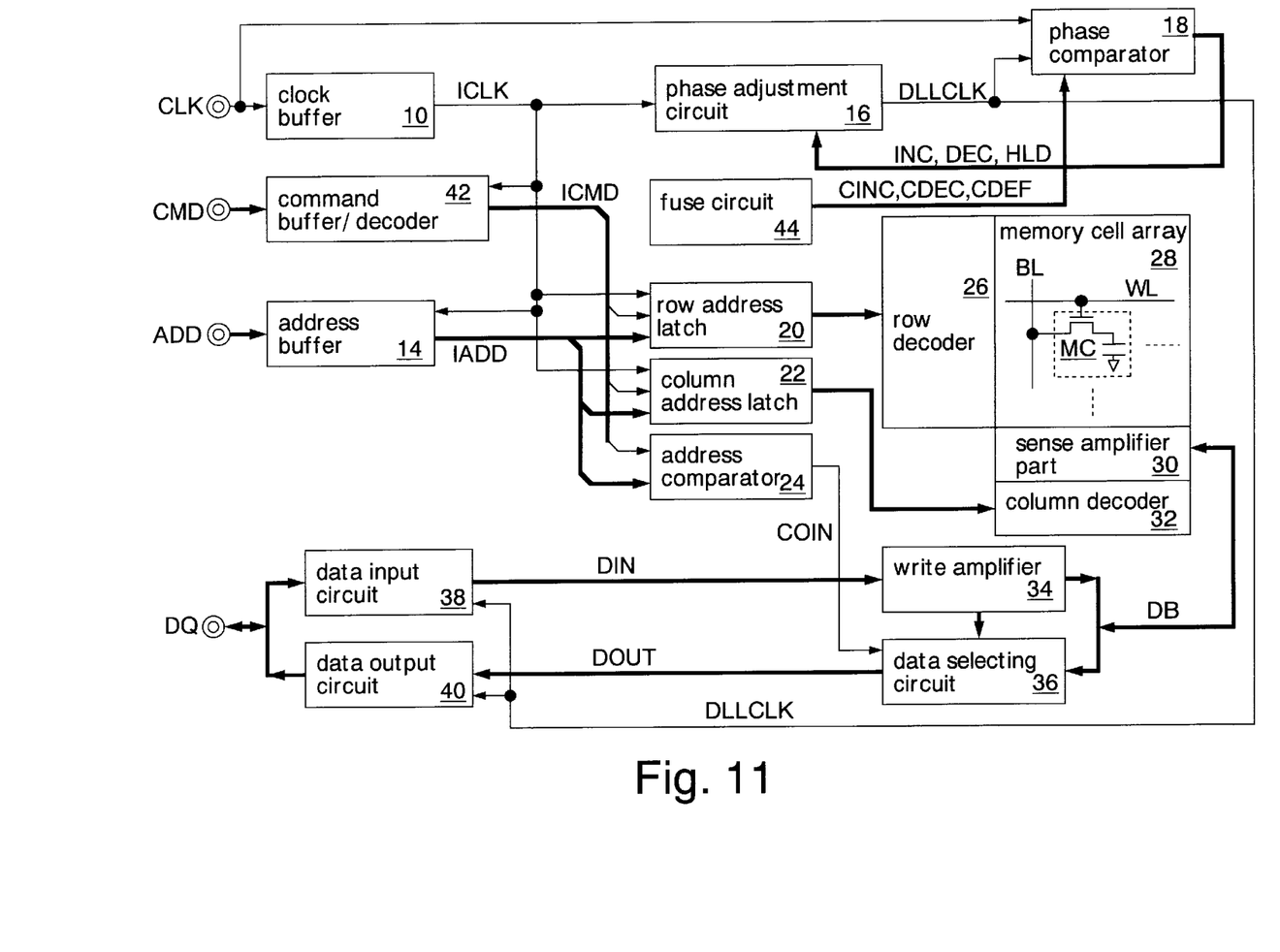
FIG. 11 is a block diagram showing a second embodiment of the present invention.

FIG. 11 shows a second embodiment of the semiconductor memory device of the present invention. The same circuits and signals as those described in the conventional art and the first embodiment will be designated by identical reference numbers or symbols. Detailed description thereof will be omitted here.

In this embodiment, a command buffer/decoder 42 is formed instead of the command buffer/decoder 12 of the first embodiment. The command buffer/decoder 42 receives only those commands related to the memory operation of the SDRAM, such as a write command, a read command, and a NOP command. Thus, unlike with the first embodiment, the command buffer/decoder 42 receives none of the increment command (CINC), the decrement command (CDEC), and the default command (CDEF).

The SDRAM is also provided with an additional fuse circuit 44. The fuse circuit 44 has a plurality of fuses. The fuses are programmed in a fabrication process (test process) after the completion of the wafer on which a plurality of SDRAMs are formed. The fuse circuit 44 keeps any one of the command signals CINC, CDEC, and CDEF at high level according to the fuse programming. The rest of the configuration is the same as in the first embodiment.

The embodiment can offer the same effects as those of the foregoing first embodiment. Besides, in this embodiment, the fuse circuit 44 keeps any one of the command signals CINC, CDEC, and CDEF at high level. Consequently, programming the fuse circuit 42 fuse circuit 44 according to the product specifications, for example, can facilitate fabricating SDRAMs of different access times tAC. Moreover, SDRAMs whose access times tAC are out of specifications when under the command signal CDEF can be programmed with the command signal CDEC to bring the access times tAC to within the specifications. As a result, access-defective SDRAMs can be turned into conforming items with an enhancement in yield.

Figure 12:
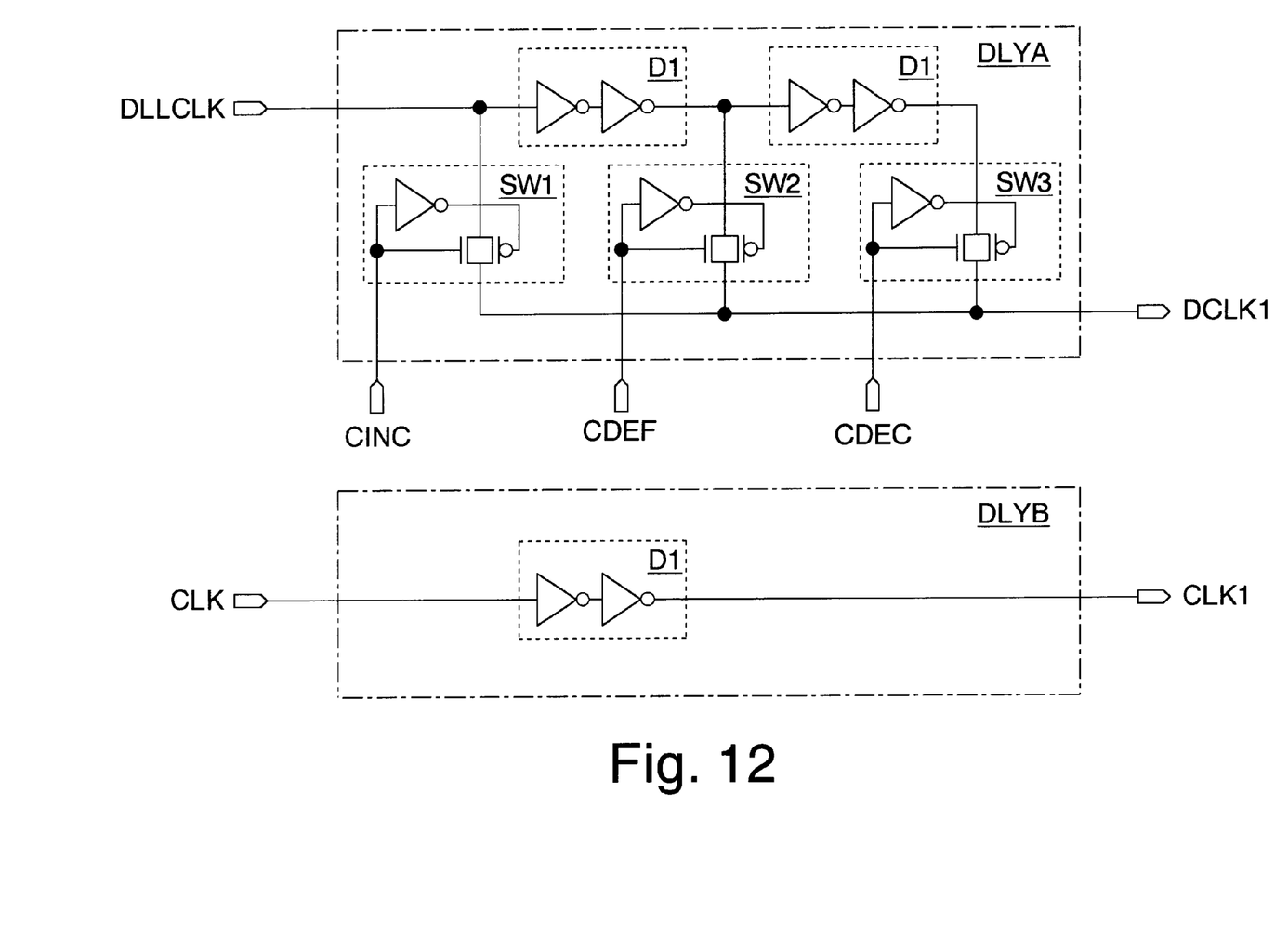
FIG. 12 is a circuit diagram showing another example of the delay circuits.

The foregoing first and second embodiments have dealt with the cases where the delay circuit DLYB shown in FIG. 4 is configured as a variable delay circuit so that the phase of the delayed clock signal CLK1 is adjusted with respect to the delayed clock signals DCLK. However, the present invention is not limited to such embodiments. For example, as shown in FIG. 12, the delay circuit DLYA of the phase comparator may be configured as a variable delay circuit so that the phases of the delayed clock signals DCLK are adjusted with respect to the delayed clock signal CKL1.

The foregoing second embodiment has dealt with the case where the fuse circuit 44 is programmed to set any one of the increment command CINC, the decrement command CDEC, and the default command CDEF. However, the present invention is not limited to such an embodiment. For example, instead of the fuse circuit 44, conductive layers to be formed in predetermined positions on the SDRAM according to the pattern shape of the photomask used in the fabrication process of the SDRAM may be used to set any one of the increment command CINC, the decrement command CDEC, and the default command CDEF.

The invention is not limited to the above embodiments and various modifications may be made without departing from the spirit and scope of the invention. Any improvement may be made in part or all of the components.

What is claimed is:

1. A semiconductor memory device comprising:

a memory cell array having memory cells;

a phase adjustment circuit for delaying an external clock signal by a predetermined time to generate an adjusted clock signal;

a phase comparator for comparing phases of said external clock signal and said adjusted clock signal, and for outputting a phase adjustment signal to adjust a delay time of said phase adjustment circuit in accordance with the comparison result;

a data output circuit for outputting read data from said memory cell array to a data terminal in synchronization with said adjusted clock signal; and a data input circuit for receiving write data written to said memory cell array in synchronization with said adjusted clock signal, said write data also being supplied to said data terminal, wherein said phase adjustment circuit generates said adjusted clock signal leading said external clock signal in phase, while said phase comparator is detecting a coincidence in phase.

2. The semiconductor memory device according to claim 1, comprising:

an address terminal for receiving a write address to select a memory cell to which data is written, out of said memory cells, and a read address to select a memory cell from which data is read, out of said memory cells;

an address comparator comparing said write address and said read address received by said address terminal; and a data selecting circuit for outputting write data supplied in correspondence with said write address to said data output circuit, the write data outputted as read data corresponding to said read address, when result of the comparison by said address comparator indicates that said write address and said read address coincide with each other.

3. A semiconductor memory device, comprising:

a memory cell array having memory cells;

a phase adjustment circuit for delaying an external clock signal by a predetermined time to generate an adjusted clock signal;

a phase comparator for comparing phases of said external clock signal and said adjusted clock signal, and for outputting a phase adjustment signal to adjust a delay time of said phase adjustment circuit in accordance with the comparison result;

a data output circuit for outputting read data from said memory cell array to a data terminal in synchronization with said adjusted clock signal;

a data input circuit for receiving write data written to said memory cell array in synchronization with said adjusted clock signal, said write data also being supplied to said data terminal;

an external terminal for receiving a command signal; and a variable delay circuit for changing a phase of one of said external clock signal and said adjusted clock signal to be compared by said phase comparator, in accordance with said command signal.

4. A semiconductor memory device, comprising:

a memory cell array having memory cells;

a phase adjustment circuit for delaying an external clock signal by a predetermined time to generate an adjusted clock signal;

a phase comparator for comparing phases of said external clock signal and said adjusted clock signal, and for outputting a phase adjustment signal to adjust a delay time of said phase adjustment circuit in accordance with the comparison result;

a data output circuit for outputting read data from said memory cell array to a data terminal in synchronization with said adjusted clock signal;

a data input circuit for receiving write data written to said memory cell array in synchronization with said adjusted clock signal, said write data also being supplied to said data terminal;

a fuse circuit for outputting a command signal; and a variable delay circuit for changing a phase of one of said external clock signal and said adjusted clock signal to be compared by said phase comparator, in accordance with said command signal.

* * * * *